(12) United States Patent
Xiong (10) Patent No.: US 9,891,464 B2
(45) Date of Patent: Feb. 13, 2018

(54) COLOR RESIST MASK SHEET AND METHOD OF USE THEREOF

(71) Applicant: SHENZHEN CHINA STAR OPTOELECTRONICS TECHNOLOGY CO., LTD., Shenzhen, Guangdong (CN)

(72) Inventor: Yuan Xiong, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 322 days.

(21) Appl. No.: 14/896,672

(22) PCT Filed: Nov. 6, 2015

(86) PCT No.: PCT/CN2015/093977
§ 371 (c)(1),
(2) Date: Dec. 8, 2015

(87) PCT Pub. No.: WO2017/067024
PCT Pub. Date: Apr. 27, 2017

(65) Prior Publication Data
US 2017/0115526 A1    Apr. 27, 2017

(30) Foreign Application Priority Data

Oct. 22, 2015  (CN) .......................... 2015 1 0691024

(51) Int. Cl.
*G03F 1/42* (2012.01)
*G03F 1/44* (2012.01)
(Continued)

(52) U.S. Cl.
CPC ......... *G02F 1/133516* (2013.01); *B05D 1/32* (2013.01); *G03F 1/42* (2013.01);
(Continued)

(58) Field of Classification Search
CPC ..... G03F 1/38; G03F 1/42; G03F 1/44; G03F 7/0007; G03F 7/70633; G03F 9/7038;
(Continued)

(56) References Cited

U.S. PATENT DOCUMENTS 4,777,117 A * 10/1988 Murata ................. G03F 7/0007
                                              430/22
2015/0192823 A1* 7/2015 Fu ......................... G03F 7/2022
                                              216/23
2016/0334674 A1* 11/2016 Yu .......................... G03F 7/0007

FOREIGN PATENT DOCUMENTS

| CN | 103969873 A | * | 8/2014 |
| CN | 104808434 A | * | 7/2015 |
| JP | 2003-287873 A | * | 10/2003 |

OTHER PUBLICATIONS

Computer-generated translation of JP 2003-287873 (Oct. 2003).*
Computer-generated translation of CN 103969873 (Aug. 2014).*
Computer-generated translation of CN 104808434 (Jul. 2015).*

* cited by examiner

*Primary Examiner* — John A McPherson
(74) *Attorney, Agent, or Firm* — Soroker Agmon Nordman (57) ABSTRACT

The present invention provides a color resist mask sheet and a method of use thereof. The color resist mask sheet includes an align coat mark region and an align test mark region. The align coat mark region includes a plurality of equally spaced align coat marks of coat color resist; the align test mark region includes a plurality of equally spaced align test marks for coating the test color resist, wherein each align test mark corresponds to each align coat mark.

19 Claims, 3 Drawing Sheets

(51) Int. Cl.
*G02B 5/20* (2006.01)
*G02F 1/1335* (2006.01)
*G03F 7/00* (2006.01)
*B05D 1/32* (2006.01)

(52) U.S. Cl.
CPC .............. *G03F 1/44* (2013.01); *G03F 7/0007* (2013.01); *G02B 5/201* (2013.01)

(58) Field of Classification Search
CPC ....... G03F 9/7073; G02B 5/201; G02B 5/223; G02F 1/133516
USPC .................................. 430/5, 7, 22; 349/106
See application file for complete search history.

COLOR RESIST MASK SHEET AND METHOD OF USE THEREOF

BACKGROUND OF THE INVENTION

1. Field of the Invention

The present invention relates to the field of LCD (Liquid Crystal Display) technology, and in particular to a color resist mask sheet and a method of use thereof.

2. Description of the Related Art

LCD displays are widely used in various fields due to their smaller size, lighter weight, etc. The display panel is a major component of the liquid crystal display; the main structure of the display panel includes an array substrate, a color film substrate disposed opposite the array substrate, and a liquid crystal layer disposed between the array substrate and the color film substrate, wherein, the liquid crystal display capable of rendering color images is mainly based on a RGB (Red-Green-Blue) color resist in the color film substrate.

Before coating the RGB color resist, it is necessary to manufacture a color resist test sheet, to test the characteristics of exposure, film thickness, color gamut, color coordinates, and other parameters of the RGB color resist. After the test is passed, the color resist mask sheet is then used to form the RGB color resist on the color film substrate. This requires using two masks to conduct the aligning operation twice to complete the manufacturing, of the RGB color resist, resulting in a higher production cost of manufacturing the color film substrate.

Thus, it is necessary to provide a color resist mask sheet and a method of use thereof, to solve the existing problem of the prior art.

SUMMARY OF THE INVENTION

In view of this, the present invention provides a color resist mask sheet and a method of use thereof to reduce the production cost of the color film substrate, which can solve the technical problem of the higher production cost of manufacturing the existing color film substrate.

To solve the aforementioned technical problem, the present invention provides the following technical solution:

The present invention provides a color resist mask sheet used for coordinating with a mask aligner stepper to manufacture a color resist test sheet, including: an align test mark region comprising a plurality of equally spaced align test marks; an align coat mark region comprising a plurality of equally spaced align coat marks, wherein the align coat mark and the align test mark cooperate to locate a coat region of the test color resist; and a pattern mask region comprising a plurality of mask patterns for coating the test color resist; wherein each align test mark corresponds to each align coat mark; a space between the adjacent align coat marks, and a space between the adjacent align test marks are determined according to a space between adjacent pixels and a length of an edge of a single exposure region of the mask aligner stepper; a space between the align coat mark and the corresponding align test mark is determined according to the space between adjacent pixels; wherein a pattern of the align test mark is different from a pattern of the align coat mark; wherein the space between the adjacent align coat marks is greater than or equal to the length of the edge of the single exposure region of the mask aligner stepper, a transverse space between the adjacent align test marks is greater than or equal to the length of the edge of the single exposure region of the mask aligner stepper, a portrait space between the adjacent align test marks is equal to a portrait space between the adjacent pixels.

In the color resist mask sheet of the present invention, the space between the align coat mark and the corresponding align test mark matches:

$$d = \text{num} * n * p;$$

wherein d is the space between the align coat mark and the corresponding align test mark, num is a number of the align coat marks in the align coat mark region, p is the space between the adjacent pixels, n is any integer larger than 1, and d is greater than the length of the edge of the single exposure region of the mask aligner stepper.

In the color resist mask sheet of the present invention, the align coat mark includes a red align coat mark, a blue align coat mark, and a green align coat mark; the align test mark includes a red align test mark, a blue align test mark and a green align test mark.

In the color resist mask sheet of the present invention, the align coat mark includes a red align coat mark, a blue align coat mark, a green align coat mark, and a yellow align coat mark; the align test mark includes a red align test mark, a blue align test mark, a green align test mark, and a yellow align test mark.

The present invention provides a color resist mask sheet cooperating with a mask aligner stepper to manufacture a color resist test sheet, including: an align test mark region including a plurality of equally spaced align test marks; an align coat mark region including a plurality of equally spaced align coat marks, wherein the align coat marks and the align test marks cooperate to locate a coat region of the test color resist; and a pattern mask region including a plurality of mask patterns for coating the test color resist; wherein each align test mark corresponds to each align coat mark; a space between the adjacent align coat marks, and a space between the adjacent align test marks are determined according to a space between adjacent pixels and a length of an edge of a single exposure region of the mask aligner stepper; a space between the align coat mark and the corresponding align test mark is determined according to the space between adjacent pixels.

In the color resist mask sheet of the present invention, a pattern of the align test mark is different from a pattern of the align coat mark.

In the color resist mask sheet of the present invention, the space between the adjacent align coat marks is greater than or equal to the length of the edge of the single exposure region of the mask aligner stepper.

In the color resist mask sheet of the present invention, a transverse space between the adjacent align test marks greater than or equal to the length of the edge of the single exposure region of the mask aligner stepper.

In the color resist mask sheet of the present invention, a portrait space between the adjacent align test marks is equal to a portrait space between the adjacent pixels.

In the color resist mask sheet of the present invention, the space between the align coat mark and the corresponding align test mark matches:

$$d = \text{num} * n * p;$$

wherein d is the space between the align coat mark and the corresponding align test mark, num is a number of the align coat marks in the align coat mark region, p is the space between the adjacent pixels, n is any integer larger than 1, and d is greater than the length of the edge of the single exposure region of the mask aligner stepper.

In the color resist mask sheet of the present invention, the align coat mark includes a red align coat mark, a blue align coat mark and a green align coat mark; the align test mark includes a red align test mark, a blue align test mark, and a green align test mark.

In the color resist mask sheet of the present invention, the align coat mark includes a red align coat mark, a blue align coat mark, a green align coat mark, and a yellow align coat mark; the align test mark includes a red align test mark, a blue align test mark, a green align test mark, and a yellow align test mark.

The present invention further provides a method of using a color resist mask sheet, for coordinating with a mask aligner stepper to manufacture a color resist test sheet, wherein the color resist mask sheet includes: an align test mark region including a plurality of equally spaced align test marks; an align coat mark region including a plurality of equally spaced align coat marks, wherein the align coat marks and the align test marks cooperate to locate a coat region of the test color resist; and a pattern mask region including a plurality of mask patterns for coating the test color resist; wherein each align test mark corresponds to each align coat mark; a space between the adjacent align coat marks, and a space between the adjacent align test marks are determined according to a space between adjacent pixels and a length of an edge of a single exposure region of the mask aligner stepper; a space between the align coat marks and the corresponding align test marks is determined according to the space between adjacent pixels. The method of using the color resist mask sheet includes: using the align test marks of the align test mark region of the color resist mask sheet, conducting a graphical processing to the test color resist layer of the edge of the color resist test sheet, to form substrate align test marks consisting of the test color resist on an edge of the color resist test sheet; and using the mask patterns of the pattern mask region of the color resist mask sheet, conducting the graphical processing to the test color resist layer of a middle part of the color resist test sheet according to the substrate align test mark and the align coat mark, to form a test color resist pattern consisting of the test color resist on the middle part of the color resist test sheet.

In the method of using the color resist mask sheet of the present invention, the align coat mark includes a red align coat mark, a blue align coat mark, and a green align coat mark; the align test mark includes a red align test mark, a blue align test mark, and a green align test mark. The method of using the color resist mask sheet includes: coating a test red color resist layer; using the red align test mark, the blue align test mark and the green align test mark of the align test mark region of the color resist mask sheet, to conduct the graphical processing to the test red color resist layer of the edge of the color resist test sheet, to form a substrate red align test mark, a substrate blue align test mark and a substrate green align test mark consisting of the test color resist on the edge of the color resist test sheet; using the mask patterns of the pattern mask region of the color resist mask sheet, conducting the graphical processing to the test red color resist layer of the middle part of the color resist test sheet, and forming a red color resist pattern on the middle part of the color resist test sheet; coating a test blue color resist layer; adjusting a position of the color resist mask sheet according to the substrate blue align test mark and the blue align coat mark; using the mask patterns of the pattern mask region of the color resist mask sheet, conducting the graphical processing to the test blue color resist layer of the middle part of the color resist test sheet, and forming a test blue color resist pattern on the middle part of the color resist test sheet; coating a test green color resist layer; adjusting a position of the color resist mask sheet according to the substrate green align test mark and the green align coat mark; using the mask patterns of the pattern mask region of the color resist mask sheet, conducting the graphical processing to the test green color resist layer of the middle part of the color resist test sheet, and forming a test green color resist pattern on the middle part of the color resist test sheet.

In the method of using the color resist mask sheet of the present invention, a pattern of the align test mark is different from a pattern of the align coat mark.

In the method of using the color resist mask sheet of the present invention, the space between the adjacent align coat marks is greater than or equal to the length of the edge of the single exposure region of the mask aligner stepper.

In the method of using the color resist mask sheet of the present invention, a transverse space between the adjacent align test marks greater than or equal to the length of the edge of the single exposure region of the mask aligner stepper.

In the method of using the color resist mask sheet of the present invention, a portrait space between the adjacent align test marks is equal to a portrait space between the adjacent pixels.

In the method of using the color resist mask sheet of the present invention, the space between the align coat mark and the corresponding align test mark matches:

$$d = num * n * p;$$

wherein d is the space between the align coat mark and the corresponding align test mark, num is a number of the align coat marks in the align coat mark region, p is the space between the adjacent pixels, n is any integer larger than 1, and d is greater than the length of the edge of the single exposure region of the mask aligner stepper.

Compared with the existing technology, the color resist mask sheet and the method thereof, through disposing the align coat mark region having the align coat mark and the align test mark region having the align test mark on the same mask at the same time, and in the meanwhile, determining the space between the align coat mark and the corresponding align test mark, according to the space between the adjacent pixels, the production cost of the color film substrate is thus reduced, and the technical problem of the higher production cost of manufacturing the existing color film substrate is thus solved.

BRIEF DESCRIPTION OF THE DRAWINGS

The accompanying drawings are included to provide a further understanding of the invention, and are incorporated into, and constitute a part of, this specification. The drawings illustrate embodiments of the invention and, together with the description, serve to explain the principles of the invention.

DESCRIPTION OF THE EMBODIMENTS

As used in this specification the term "embodiment" means an instance, an example, or an illustration. In addition, for the articles in this specification and the appended claims, "a" or "an" in general can be interpreted as "one or more" unless specified otherwise or clear from context to determine the singular form.

Figure 1:
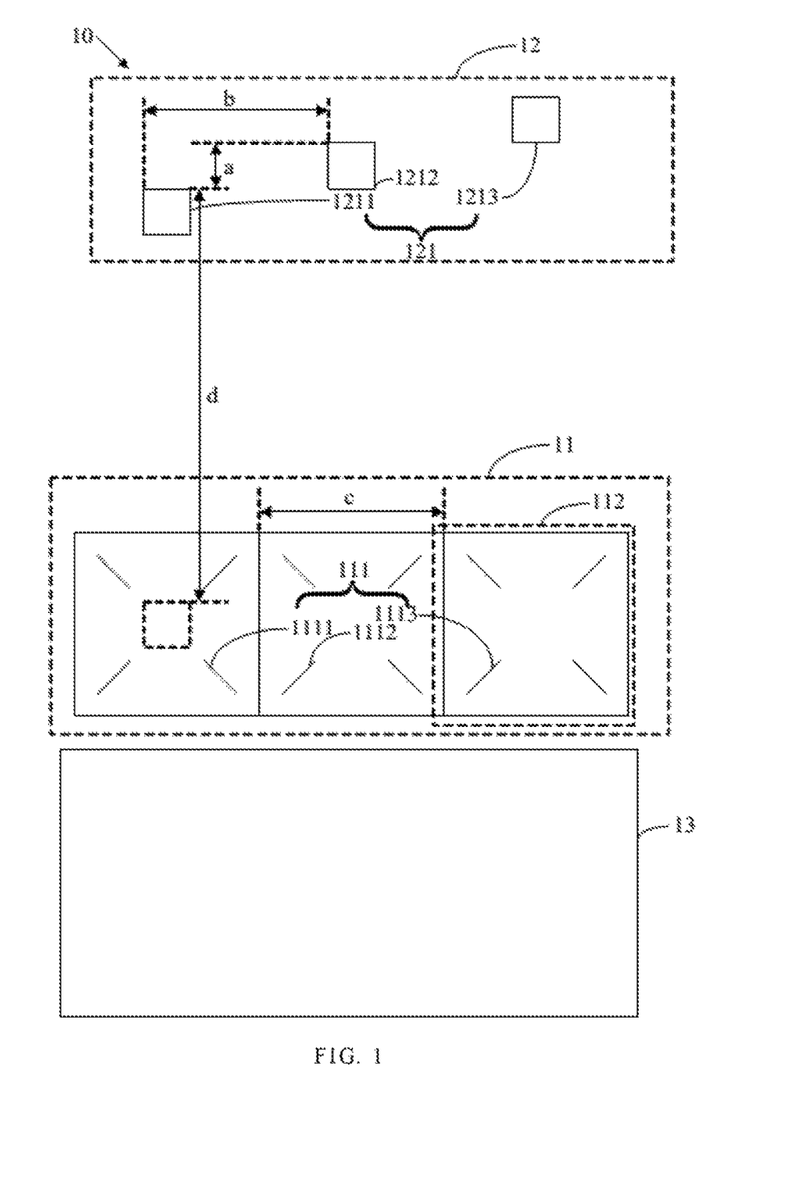
FIG. 1 illustrates a structure of the color resist mask sheet of the preferred embodiment of the present invention.

Please refer to FIG. 1, which illustrates a structure of a color resist mask sheet 10 of the preferred embodiment of the present invention. In the preferred embodiment, the color resist mask sheet 10 includes an align coat mark region 11, an align test mark region 12 and a pattern mask region 13. The align test mark region 12 includes a plurality of equally spaced align test marks 121 (only one shown in FIG. 1). The align coat mark region 11 includes a plurality of equally spaced align coat marks 111 (only one shown in FIG. 1), wherein the align coat marks 111 and the align test marks 121 cooperate to locate a coat region of the test color resist. The pattern mask region 13 includes a plurality of mask patterns for coating the test color resist (not shown in the figure). The mask patterns each can be predetermined to be any pattern, wherein the pattern of align test mark 121 is different from the pattern of the align coat mark 111. In the preferred embodiment, the align test mark 121 is a square pattern, the align coat mark 111 is a "*" shaped pattern.

Each align test mark 121 corresponds to each align coat mark 111. A space between the adjacent align coat marks 111, and a space between the adjacent align test marks 121 are determined according to a space between adjacent pixels and a length of an edge of a single exposure region 112 of a mask aligner stepper (not shown). In particular, the space c between the adjacent align coat marks 111 is greater than or equal to the length of the edge of the single exposure region 112 of the mask aligner stepper. A transverse space b between the adjacent align test marks 121 is greater than or equal to the length of the edge of the single exposure region 112 of the mask aligner stepper. A portrait space a between the adjacent align test marks 121 is equal to a portrait space between the adjacent pixels.

To ensure that two exposure operations will not affect each other, the space c between the adjacent align coat marks 111 and the transverse space b between the adjacent align test marks 121 both should be larger than or equal to the length of the edge of the single exposure region 112 of the mask aligner stepper. If the single exposure region 112 is a square region, the length of the edge of the single exposure region 112 is the length of the edge of the square region, if the single exposure region 112 is a rectangular, the length of the edge of the single exposure region 112 is the long edge or the short edge of the rectangular region.

The space between the align coat marks 111 and the corresponding align test marks 121 is determined according to the space of the adjacent pixels; in particular the space between the align coat marks 111 and the corresponding align test marks 121 matches:

$d = num * n * p;$ wherein d is the space between the align coat mark and the corresponding align test mark, num is a number of the align coat marks 111 in the align coat mark region 11, p is the space between the adjacent pixels, n is any integer larger than 1, and d is greater than the length of the edge of the single exposure region 112 of the mask aligner stepper. d is greater than the length of the edge of the single exposure region 112 of the mask aligner stepper here for preventing an exposure operation during the manufacturing of the align test mark 121 from affecting the following manufacturing of the test color resist.

In the preferred embodiment, the align coat mark 111 includes a red align coat mark 1111, a blue align coat mark 1112 and a green align coat mark 1113; the align test mark 121 includes a red align test mark 1211, a blue align test mark 1212, and a green align test mark 1213. Thus the value of the above parameter num is 3.

When the color resist mask sheet 10 of the preferred embodiment coordinating with a mask aligner stepper to manufacture a color resist test sheet is used, the red color resist layer is coated on the substrate of the color resist test sheet first, the red align test mark 1211, the blue align test mark 1212, and the green align test mark 1213 of the align test mark region 12 of the color resist mask sheet 10 are then used to conduct the graphical processing to the test red color resist layer of the edge of the color resist test sheet, in order to form the substrate red align test mark 21, the substrate blue align test mark 22, and the substrate green align test mark 23 consisted of the test red color resist on the edge of the color resist test sheet.

Figure 2A:
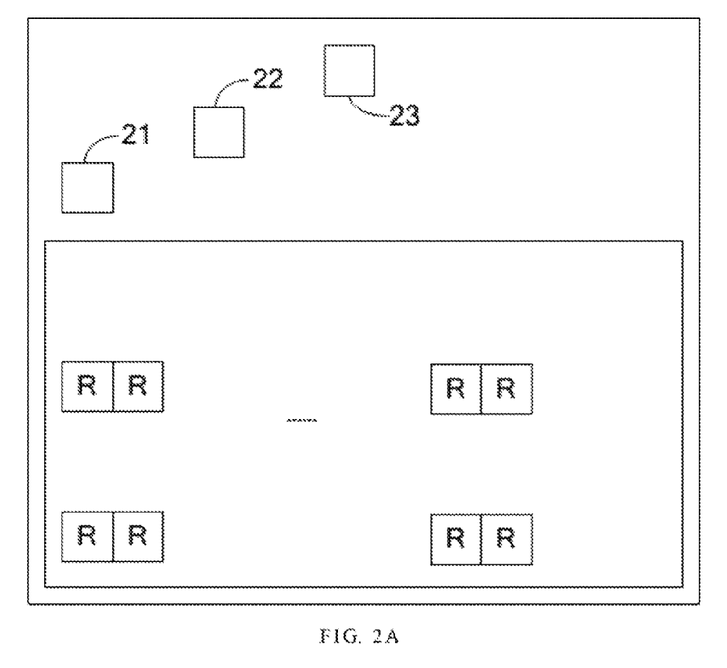
FIG. 2A illustrates the first diagram of manufacturing the color resist test sheet using the color resist mask sheet of the present invention.

The mask patterns of the pattern mask region 13 of the color resist mask sheet 10 are then used, to conduct the graphical processing to the test red color resist layer of the middle part of the color resist test sheet, to form the test red color set pattern R on the middle part of the color resist test sheet. In particular, through moving the color resist test sheet by three times of the space distance between the adjacent pixels (in order to pass the region of the test blue color set pattern and the test green color set pattern) here, to conduct the graphical processing to all of the test red color resist layers of the middle part of the color resist test sheet, in order to form the test red color set pattern R on the middle part of the color resist test sheet. The pattern of the current color resist test sheet is shown as FIG. 2A. For displaying the image clearly, the scale of the sizes and the positions of the test red color set pattern R, the substrate red align test mark 21, the substrate blue align test mark 22, and the substrate green align test mark 23 are adjusted here.

The test blue color resist layer is then coated on the substrate of the color resist test sheet. According to the substrate blue align test mark 22 and the blue align coat mark 1112, the position of the color resist mask sheet 10 is adjusted. That is, the blue align coat mark 1112 of the color resist mask sheet 10 is moved to align with the substrate blue align test mark 22 of the substrate, or the substrate blue align test mark 22 of the substrate is moved to align with the blue align coat mark 1112 of the color resist mask sheet 10. Because the space between the blue align coat mark 1112 and the corresponding blue align test mark 1212 matches the condition: d=num*n*p, thus the moved mask patterns of the pattern mask region 13 of the color resist mask sheet 10 can face the region of the test blue color resist layer of the color resist test sheet.

Figure 2B:
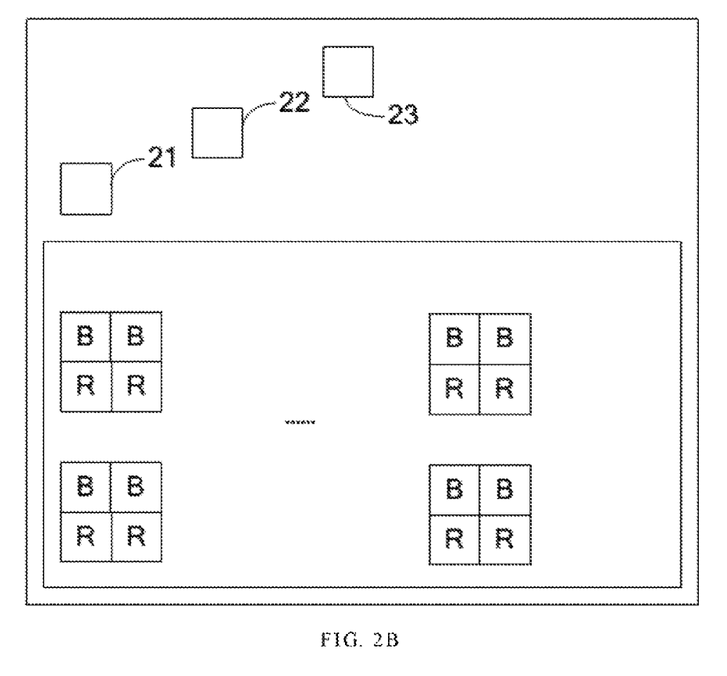
FIG. 2B illustrates the second diagram of manufacturing the color resist test sheet using the color resist mask sheet of the present invention.

The mask patterns of the pattern mask region 13 of the color resist mask sheet 10 are then used, to conduct the graphical processing to the test blue color resist layer of the middle part of the color resist test sheet, to form the test blue color set pattern B on the middle part of the color resist test sheet. In particular, through moving the color resist test sheet by three times of the space distance between the adjacent pixels here, to conduct the graphical processing to all of the test blue color resist layers of the middle part of the color resist test sheet, in order to form the test blue color set pattern B on the middle part of the color resist test sheet. The pattern of the current color resist test sheet is shown as FIG. 2B.

The test green color resist layer is then coated on the substrate of the color resist test sheet; according to the substrate green align test mark 23 and the green align coat mark 1113, the position of the color resist mask sheet 10 is adjusted. That is, the green align coat mark 1113 of the color resist mask sheet 10 is moved to align with the substrate green align test mark 23 of the substrate, or the substrate green align test mark 23 of the substrate is moved to align with the green align coat mark 1113 of the color resist mask sheet 10. Because the space between the green align coat mark 1113 and the corresponding green align test mark 1213 matches the condition: d=num*n*p, the moved mask patterns of the pattern mask region 13 of the color resist mask sheet 10 can face the region of test green color resist layer of the color resist test sheet.

Figure 2C:
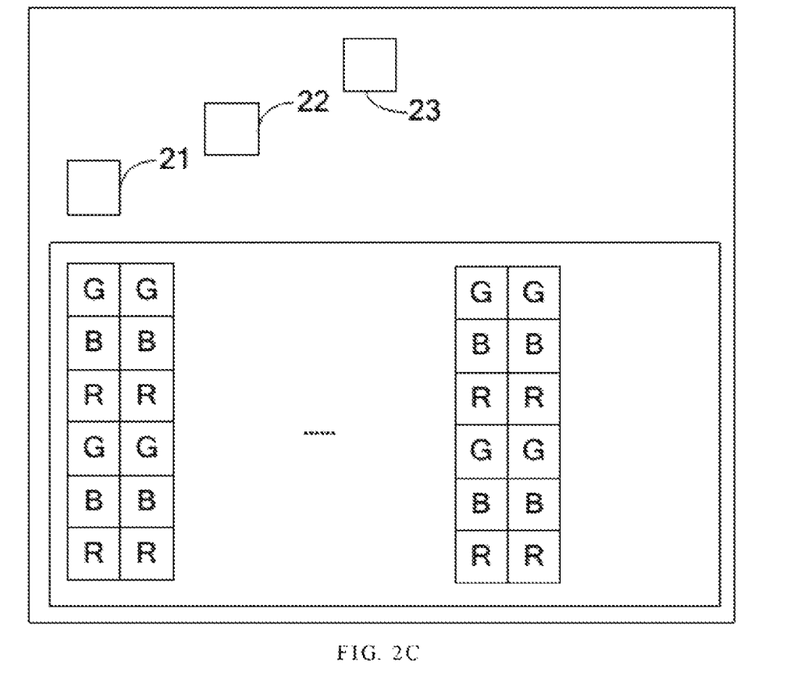
FIG. 2C illustrates the third diagram of manufacturing the color resist test sheet using the color resist mask sheet of the present invention.

The mask patterns of the pattern mask region 13 of the color resist mask sheet 10 are then used to conduct the graphical processing to the test green color resist layer of the middle part of the color resist test sheet, and to form the test green color set pattern G on the middle part of the color resist test sheet. In particular, through moving the color resist test sheet by three times distance of the space between the adjacent pixels here to conduct the graphical processing to all of the test green color resist layers of the middle part of the color resist test sheet, in order to form the test green color set pattern G on the middle part of the color resist test sheet. The pattern of the current color resist test sheet is shown as FIG. 2C.

Thus the manufacturing process of the color resist mask sheet 10 of the preferred embodiment coordinating with the mask aligner stepper to manufacture the RGB color resist test sheet is completed.

Preferably, the align coat mark of the color resist mask sheet of the preferred embodiment can include a red align coat mark, a blue align coat mark, a green align coat mark, and a yellow align coat mark. The align test mark includes a red align test mark, a blue align test mark, a green align test mark, and a yellow align test mark. In this way, the space d between the align coat mark and the corresponding align test mark matches the condition: d=num*n*p, and only the num is set to be 4, while the others are equal to or similar to the manufacturing process of the color resist test sheet mentioned above. The manufacture of the RBGY (Red-Blue-Green-Yellow) color resist test sheet can be completed in the same way.

The color resist mask sheet of the preferred embodiment is disposed with both the align coat mark region having the align coat mark, and the align test mark region having the align test mark, and the space between the align coat mark and the corresponding align test mark is determined according to the space between the adjacent pixels as well. Therefore the color resist mask sheet can be used for manufacturing the color resist test sheet, and for manufacturing the color film color resist, thus reducing the production cost of the color film substrate, and solving the technical problem of the higher production cost of manufacturing the existing color film substrate.

Figure 3:
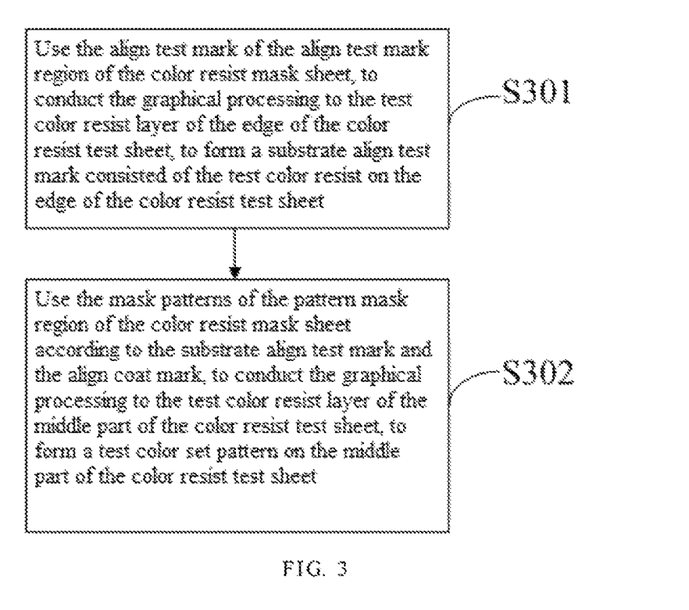
FIG. 3 illustrates a flowchart of the method of using the color resist mask sheet of the present invention.

The present invention further provides a method of using a color resist mask sheet, wherein the specific structure of the color resist mask sheet is mentioned in the preferred embodiment of the color resist mask sheet mentioned above. Please refer to FIG. 3, which illustrates a flowchart of the method of using the color resist mask sheet of the present invention. The method of using the color resist mask sheet of the preferred embodiment includes:

Step S301, using the align test marks of the align test mark region of the color resist mask sheet, conducting a graphical processing to the test color resist layer of the edge of the color resist test sheet to form substrate align test marks consisted of the test color resist on an edge of the color resist test sheet. Step S302, using the mask patterns of the pattern mask region of the color resist mask sheet, conducting the graphical processing to the test color resist layer of a middle part of the color resist test sheet according to the substrate align test mark and the align coat mark to form a test color resist pattern consisted of the test color resist on the middle part of the color resist test sheet.

The specific flow of each step of the method of using the color resist mask sheet of the preferred embodiment is described in detail in the following.

In the preferred embodiment, the align coat mark includes a red align coat mark, a blue align coat mark, and a green align coat mark; the align test mark includes a red align test mark, a blue align test mark, and a green align test mark.

In Step S301, a test red color resist layer is coated on the substrate of the color resist test sheet; then the red align test mark, the blue align test mark, and the green align test mark of the align test mark region of the color resist mask sheet are used, to conduct the graphical processing to the test red color resist layer of the edge of the color resist test sheet, to form a substrate red align test mark, a substrate blue align test mark and a substrate green align test mark consisted of the test red color resist on the edge of the color resist test sheet, and then Step S302 is processed.

In Step S302, the mask patterns of the pattern mask region of the color resist mask sheet are used, to conduct the graphical processing to the test red color resist layer of the middle part of the color resist test sheet, to form a test red color set pattern on the middle part of the color resist test sheet.

Then a test blue color resist layer is coated on the substrate of the color resist test sheet, and a position of the color resist mask sheet is adjusted according to the substrate blue align test mark and the blue align coat mark.

Then the mask patterns of the pattern mask region of the color resist mask sheet are used, to conduct the graphical processing to the test blue color resist layer of the middle part of the color resist test sheet, to form a test blue color set pattern on the middle part of the color resist test sheet.

Then a test green color resist layer is coated, and a position of the color resist mask sheet is adjusted according to the substrate green align test mark and the green align coat mark.

Then the mask patterns of the pattern mask region of the color resist mask sheet is used, to conduct the graphical processing to the test green color resist layer of the middle part of the color resist test sheet, to form a test green color set pattern on the middle part of the color resist test sheet.

In this way, the process of using the color resist mask sheet of the preferred embodiment to manufacture the RGB color resist test sheet is completed.

Preferably, the align coat mark of the color resist mask sheet of the preferred embodiment can include a red align coat mark, a blue align coat mark, a green align coat mark, and a yellow align coat mark. The align test mark includes a red align test mark, a blue align test mark, a green align test mark, and a yellow align test mark.

Preferably, a pattern of the align test mark is different from a pattern of the align coat mark; the space between the adjacent align coat marks is larger than or equal to the length of the edge of the single exposure region of the mask aligner stepper, a transverse space between the adjacent align test marks is larger than or equal to the length of the edge of the single exposure region of the mask aligner stepper, a portrait space between the adjacent align test marks is equal to a portrait space between the adjacent pixels.

Preferably, the space between the align coat mark and the corresponding align test mark matches:

$$d=num*n*p;$$

wherein d is the space between the align coat mark and the corresponding align test mark, num is a number of the align coat marks in the align coat mark region, p is the space between the adjacent pixels, n is any integer larger than 1, and d is greater than the length of the edge of the single exposure region of the mask aligner stepper.

The specific process of implementing the method of using the color resist mask sheet of the preferred embodiment is the same as the related description in the preferred embodiment of the color resist mask sheet mentioned above, please refer to the related description in the preferred embodiment of the color resist mask sheet mentioned above for specific description.

The color resist mask sheet of the present invention and the method of use thereof, through disposing the align coat mark region having the align coat mark and the align test mark region having the align test mark on the same mask at the same time, and in the meanwhile determining the space between the align coat mark and the corresponding align test mark according to the space between the adjacent pixels, reduces the production cost of the color film substrate, and solves the technical problem of the higher production cost of manufacturing the existing color film substrate.

In summary, although the present invention has been described in preferred embodiments above, the preferred embodiments described above are not intended to limit the invention. Persons skilled in the art can make various modifications to the present invention without departing from the scope of the invention as defined in the claims.

What is claimed is:

1. A color resist mask sheet used for coordinating with a mask aligner stepper to manufacture a color resist test sheet, comprising:
   an align test mark region comprising a plurality of equally spaced align test marks;
   an align coat mark region comprising a plurality of equally spaced align coat marks, wherein the align coat marks and the align test marks cooperate to locate a coat region of test color resist; and
   a pattern mask region comprising a plurality of mask patterns for coating the test color resist;
   wherein each align test mark corresponds to each align coat mark; a space between the adjacent align coat marks, and a space between the adjacent align test marks are determined according to a space between adjacent pixels and a length of an edge of a single exposure region of the mask aligner stepper; a space between the align coat mark and the corresponding align test mark is determined according to the space between adjacent pixels;
   wherein a pattern of the align test mark is different from a pattern of the align coat mark;
   wherein the space between the adjacent align coat marks is greater than or equal to the length of the edge of the single exposure region of the mask aligner stepper, a transverse space between the adjacent align test marks is greater than or equal to the length of the edge of the single exposure region of the mask aligner stepper, a portrait space between the adjacent align test marks is equal to a portrait space between the adjacent pixels.

2. The color resist mask sheet of claim 1, wherein the space between the align coat mark and the corresponding align test mark matches:

$$d=num*n*p;$$

wherein d is the space between the align coat mark and the corresponding align test mark, num is a number of the align coat marks in the align coat mark region, p is the space between the adjacent pixels, n is any integer larger than 1, and d is greater than the length of the edge of the single exposure region of the mask aligner stepper.

3. The color resist mask sheet of claim 1, wherein the align coat mark comprises a red align coat mark, a blue align coat mark, and a green align coat mark; and
   the align test mark comprises a red align test mark, a blue align test mark, and a green align test mark.

4. The color resist mask sheet of claim 1, wherein the align coat mark comprises a red align coat mark, a blue align coat mark, a green align coat mark, and a yellow align coat mark; and
   the align test mark comprises a red align test mark, a blue align test mark, a green align test mark, and a yellow align test mark.

5. A color resist mask sheet cooperating with a mask aligner stepper to manufacture a color resist test sheet, comprising:
   an align test mark region comprising a plurality of equally spaced align test mark;
   an align coat mark region comprising a plurality of equally spaced align coat mark, wherein the align coat mark and the align test mark cooperate to locate a coat region of test color resist; and
   a pattern mask region comprising a plurality of mask patterns for coating the test color resist;
   wherein each align test mark corresponds to each align coat mark; a space between the adjacent align coat marks, and a space between the adjacent align test marks are determined according to a space between adjacent pixels and a length of an edge of a single exposure region of the mask aligner stepper; a space between the align coat mark and the corresponding align test mark is determined according to the space between adjacent pixels.

6. The color resist mask sheet of claim 5, wherein a pattern of the align test mark is different from a pattern of the align coat mark.

7. The color resist mask sheet of claim 5, wherein the space between the adjacent align coat marks is greater than or equal to the length of the edge of the single exposure region of the mask aligner stepper.

8. The color resist mask sheet of claim 5, wherein a transverse space between the adjacent align test marks is greater than or equal to the length of the edge of the single exposure region of the mask aligner stepper.

9. The color resist mask sheet of claim 5, wherein a portrait space between the adjacent align test marks is equal to a portrait space between the adjacent pixels.

10. The color resist mask sheet of claim 5, wherein the space between the align coat mark and the corresponding align test mark matches:

$$d=num*n*p;$$

wherein d is the space between the align coat mark and the corresponding align test mark, num is a number of the align coat marks in the align coat mark region, p is the space between the adjacent pixels, n is any integer larger than 1, and d is greater than the length of the edge of the single exposure region of the mask aligner stepper.

11. The color resist mask sheet of claim 5, wherein the align coat mark comprises a red align coat mark, a blue align coat mark and a green align coat mark; and
the align test mark comprises a red align test mark, a blue align test mark, and a green align test mark.

12. The color resist mask sheet of claim 5, wherein the align coat mark comprises a red align coat mark, a blue align coat mark, a green align coat mark, and a yellow align coat mark; and
the align test mark comprises a red align test mark, a blue align test mark, a green align test mark, and a yellow align test mark.

13. A method of using a color resist mask sheet for coordinating with a mask aligner stepper to manufacture a color resist test sheet, wherein the color resist mask sheet comprises:
an align test mark region comprising a plurality of equally spaced align test marks;
an align coat mark region comprising a plurality of equally spaced align coat marks, wherein the align coat marks and the align test marks cooperate to locate a coat region of test color resist; and
a pattern mask region comprising a plurality of mask patterns for coating the test color resist;
wherein each align test mark corresponds to each align coat mark; a space between the adjacent align coat marks, and a space between the adjacent align test marks are determined according to a space between adjacent pixels and a length of an edge of a single exposure region of the mask aligner stepper; a space between the align coat mark and the corresponding align test mark is determined according to the space between adjacent pixels;
the method of using the color resist mask sheet comprising:
using the align test marks of the align test mark region of the color resist mask sheet, conducting a graphical processing to the test color resist layer of the edge of the color resist test sheet to form substrate align test marks consisted of the test color resist on an edge of the color resist test sheet; and
using the mask patterns of the pattern mask region of the color resist mask sheet, conducting the graphical processing to the test color resist layer of a middle part of the color resist test sheet according to the substrate align test mark and the align coat mark to form a test color resist pattern consisted of the test color resist on the middle part of the color resist test sheet.

14. The method of using the color resist mask sheet of claim 13, wherein the align coat mark comprises a red align coat mark, a blue align coat mark, and a green align coat mark; and
the align test mark comprises a red align test mark, a blue align test mark, and a green align test mark;
the method of using the color resist mask sheet comprises:
coating a test red color resist layer;
using the red align test mark, the blue align test mark and the green align test mark of the align test mark region of the color resist mask sheet, to conduct the graphical processing to the test red color resist layer of the edge of the color resist test sheet, and to form a substrate red align test mark, a substrate blue align test mark and a substrate green align test mark consisted of the test color resist on the edge of the color resist test sheet;
using the mask patterns of the pattern mask region of the color resist mask sheet, to conduct the graphical processing to the test red color resist layer of the middle part of the color resist test sheet, and to form a red color resist pattern on the middle part of the color resist test sheet;
coating a test blue color resist layer;
adjusting a position of the color resist mask sheet according to the substrate blue align test mark and the blue align coat mark;
using the mask patterns of the pattern mask region of the color resist mask sheet to conduct the graphical processing to the test blue color resist layer of the middle part of the color resist test sheet, and to form a test blue color resist pattern on the middle part of the color resist test sheet;
coating a test green color resist layer;
adjusting a position of the color resist mask sheet according to the substrate green align test mark and the green align coat mark;
using the mask patterns of the pattern mask region of the color resist mask sheet, to conduct the graphical processing to the test green color resist layer of the middle part of the color resist test sheet, and to form a test green color resist pattern on the middle part of the color resist test sheet.

15. The method of using the color resist mask sheet of claim 13, wherein a pattern of the align test mark is different from a pattern of the align coat mark.

16. The method of using the color resist mask sheet of claim 13, wherein the space between the adjacent align coat marks is greater than or equal to the length of the edge of the single exposure region of the mask aligner stepper.

17. The method of using the color resist mask sheet of claim 13, wherein a transverse space between the adjacent align test marks greater than or equal to the length of the edge of the single exposure region of the mask aligner stepper.

18. The method of using the color resist mask sheet of claim 13, wherein a portrait space between the adjacent align test marks is equal to a portrait space between the adjacent pixels.

19. The method of using the color resist mask sheet of claim 13, wherein the space between the align coat mark and the corresponding align test mark matches:

$d=\text{num}*n*p;$ wherein d is the space between the align coat mark and the corresponding align test mark, num is a number of the align coat marks in the align coat mark region, p is the space between the adjacent pixels, n is any integer larger than 1, and d is greater than the length of the edge of the single exposure region of the mask aligner stepper.

* * * * *